(12) United States Patent
Hyun et al.

(10) Patent No.: US 9,941,020 B2
(45) Date of Patent: *Apr. 10, 2018

(54) SEMICONDUCTOR SYSTEM AND METHOD FOR TESTING SEMICONDUCTOR DEVICE

(71) Applicant: SK hynix Inc., Gyeonggi-do (KR)

(72) Inventors: Sang-Ah Hyun, Gyeonggi-do (KR); Jae-Il Kim, Gyeonggi-do (KR)

(73) Assignee: SK Hynix Inc., gyeonggi-do (KR)

( * ) Notice: Subject to any disclaimer, the term of this patent is extended or adjusted under 35 U.S.C. 154(b) by 36 days.

This patent is subject to a terminal disclaimer.

(21) Appl. No.: 15/183,433

(22) Filed: Jun. 15, 2016

(65) Prior Publication Data

US 2016/0300626 A1    Oct. 13, 2016

Related U.S. Application Data

(63) Continuation-in-part of application No. 14/743,932, filed on Jun. 18, 2015, now Pat. No. 9,390,815.

(30) Foreign Application Priority Data

Mar. 5, 2015   (KR) .................. 10-2015-0030748

(51) Int. Cl.
*G11C 29/00* (2006.01)
*G11C 29/42* (2006.01)
*G11C 11/408* (2006.01)
*G11C 11/4096* (2006.01)
*G11C 29/36* (2006.01)
*G11C 29/44* (2006.01)
*G11C 29/02* (2006.01)

(Continued)

(52) U.S. Cl.
CPC ............. *G11C 29/42* (2013.01); *G11C 11/408* (2013.01); *G11C 11/4096* (2013.01); *G11C 29/022* (2013.01); *G11C 29/1201* (2013.01); *G11C 29/36* (2013.01); *G11C 29/44* (2013.01); *G11C 2029/0411* (2013.01)

(58) Field of Classification Search
CPC ... G11C 29/42; G11C 29/1201; G11C 29/022; G11C 29/44; G11C 11/4096; G11C 11/408; G11C 29/36; G11C 2029/0411
See application file for complete search history.

(56) References Cited

U.S. PATENT DOCUMENTS

2005/0063230 A1    3/2005  Seitoh
2010/0195396 A1    8/2010  Higuchi
(Continued)

FOREIGN PATENT DOCUMENTS

KR    1020040063576    7/2004
KR    1020150051705    5/2015

*Primary Examiner* — Thien Nguyen
(74) *Attorney, Agent, or Firm* — IP & T Group LLP

(57) ABSTRACT

A semiconductor device includes a plurality of first input pins; a parity check unit suitable for performing a parity check for command/address signals inputted to the plurality of first input pins, and determining the parity check result as a pass or fail; and one or more registers suitable for storing the inputted command/address signals when the parity check result is determined as the fail, wherein during a test operation, the number of signals having a first logic value among the command/address signals inputted to the plurality of first input pins does not correspond to the logic value of a parity bit.

14 Claims, 9 Drawing Sheets

(51) Int. Cl.
  *G11C 29/12*  (2006.01)
  *G11C 29/04*  (2006.01)

(56) References Cited

U.S. PATENT DOCUMENTS

2013/0346836 A1   12/2013  Song
2014/0250353 A1*  9/2014  Choi .................. G06F 11/1048
                                                      714/800

* cited by examiner

FIG. 11a

MPR0-MPR7 STORED DATA = 01001010

| I/O PIN | OUTPUT DATA |
|---------|-------------|
| DQ0 | 01001010 |
| DQ1 | 01001010 |
| DQ2 | 01001010 |
| DQ3 | 01001010 |
| DQ4 | 01001010 |
| DQ5 | 01001010 |
| DQ6 | 01001010 |
| DQ7 | 01001010 |

FIG. 11b

MPR0-MPR7 STORED DATA = 01001010

| I/O PIN | OUTPUT DATA |
|---------|-------------|
| DQ0 | 0 |
| DQ1 | 1 |
| DQ2 | 0 |
| DQ3 | 0 |
| DQ4 | 1 |
| DQ5 | 0 |
| DQ6 | 1 |
| DQ7 | 0 |

SEMICONDUCTOR SYSTEM AND METHOD FOR TESTING SEMICONDUCTOR DEVICE

CROSS-REFERENCE TO RELATED APPLICATIONS

This application is a continuation-in-part of U.S. patent application Ser. No. 14/743,932 filed on Jun. 18, 2015, which claims priority of Korean Patent Application No. 10-2015-0030748, filed on Mar. 5, 2015. The disclosure of each of the foregoing applications is incorporated herein by reference in its entirety.

BACKGROUND

1. Field

This patent document relates to a semiconductor system and a method for testing a semiconductor device.

2. Description of the Related Art

Semiconductor devices including DRAM and the like have been changed in various manners to satisfy a variety of demands. One such structural change is the development of a multi-chip package (MCP). A MCP is a packaged chip containing multiple chips. The packaging technology for semiconductor devices has continuously developed to reduce size and increase storage capacity. Recently, various stacked semiconductor package technologies have been developed that are efficient to mount as well as able to reduce size and increase storage capacity.

When a semiconductor package is fabricated, a probe test device is used to perform an OS (Open/Short) tostto detect whether input/output pins (for inputting/outputting signals to/from a semiconductor device included in the semiconductor package) are properly coupled to the internal circuitry. Furthermore, when a defective cell is detected after the packaged function test device tests whether the semiconductor device operates properly, the defective cell is repaired with a redundancy cell. The OS test detects whether the input/output pins of the semiconductor device in the semiconductor package is properly coupled to balls of the semiconductor package. This test also determines whether signals inputted to the semiconductor package can be properly transmitted to the semiconductor device, or whether signals transmitted from the semiconductor device can be properly output from the semiconductor package.

The OS test is performed before the package test because the function test result can only be trusted only when there are no defects in the OS test. That is, defective cells can be detected and repaired under the assumption that the input/output pins are properly coupled. In this way, semiconductor devices that would otherwise have to be discarded can be saved.

However, in order to reduce fabrication time and costs, an OS test using a probe test device may be skipped, and a package function test device may be used directly to perform a function test and a repair operation. In this case, it is impossible to guarantee that there is no OS defect in the input/output pins of the semiconductor device.

SUMMARY

Various embodiments are directed to a semiconductor system capable of performing an OS test through a package function test device that performs a function test for a semiconductor device using multi-purpose registers (MPR) provided in the semiconductor device, and a method for testing a semiconductor device.

In an embodiment, a semiconductor device may include: a plurality of first input pins; a parity check unit suitable for performing a parity check for command/address signals inputted to the plurality of first input pins, and determining the parity check result as a pass or fail; and one or more registers suitable for storing the inputted command/address signals when the parity check result is determined as the fail, wherein during a test operation, the number of signals having a first logic value among the command/address signals inputted to the plurality of first input pins does not correspond to the logic value of a parity bit.

In an embodiment, a semiconductor system may include: a plurality of first input pins; and one or more registers, wherein the semiconductor device performs one or more test operations in response to a first group of signals among a plurality of command/address signals inputted to the plurality of first input pins, the one or more test operations comprising an operation of storing a second group of signals among the plurality of command/address signals inputted to the plurality of first input pins into the one or more registers and an operation of outputting the data stored in the one or more registers.

BRIEF DESCRIPTION OF THE DRAWINGS

FIGS. 11A and 11B are diagrams for describing an OS test operation for data input/output pins of a semiconductor device in accordance with an embodiment.

DETAILED DESCRIPTION

Figure 1:
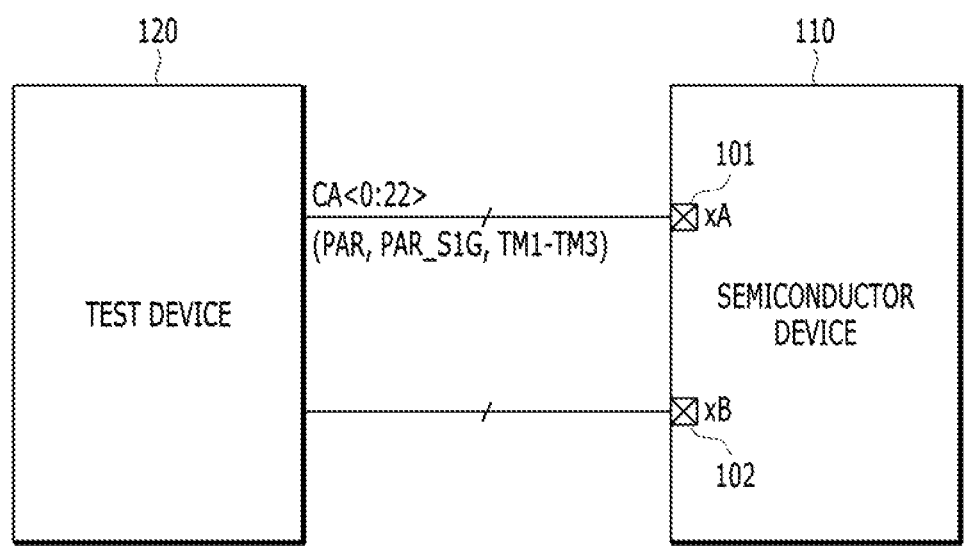
FIG. 1 is a configuration diagram of a semiconductor system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure like reference numerals refer to like parts throughout the various figures and embodiments of the present invention.

FIG. 1 is a configuration diagram of a semiconductor system in accordance with an embodiment of the present invention.

Referring to FIG. 1, the semiconductor system may include a semiconductor device 110 and a function test device 120. The semiconductor device 110 may include input pins 101 and input/output pins 102. The function test device 120 may perform a function test to test a function of a semiconductor package, and perform an OS test for the input pins 101 of the semiconductor device 110 through the function test. The input pins 101 may receive command/address (CA) signals CA<0:22> and other signals from the function test device 120, and the input/output pins 102 may exchange data and other signals with the function test device 120. In FIG. 1, nominal indication "xA" may represent the number of input pins 101, where "A" represents a natural number larger than 23, and nominal indication "xB" may represent the number of input/output pins 102. where B represents a natural number.

For reference, the CA signals CA<0:22> may include command signals for conveying commands to the semiconductor device, such as an active command signal CA<0>, a row address strobe signal CA<1>, a column address strobe signal CA<2> and a write enable signal CA<3>. Furthermore, the CA signals CA<0:22> may include address signals such as bank group address signals CA<4:5>, bank address signals CA<6:7>, and address signals CA<8:22>, which are used to select a part to be accessed in the semiconductor device 110 or used for various settings of the semiconductor device 110. That is, the CA signals may include the command signals CA<0:3> the bank group address signals CA<4:5>, the bank address signals CA<6:7>, and the address signals CA<8:22>.

Figure 2:
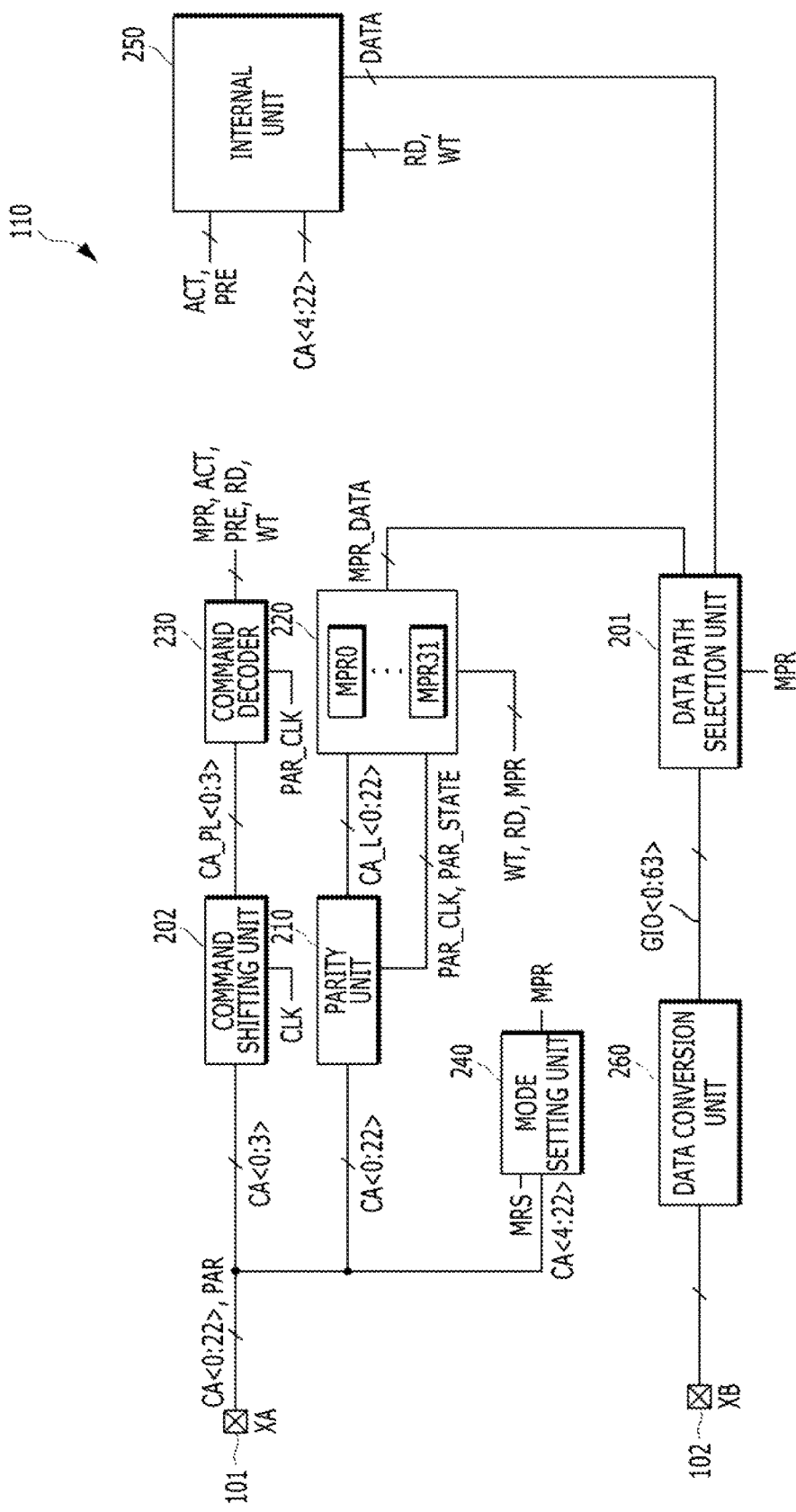
FIG. 2 is a configuration diagram of a semiconductor device in accordance with an embodiment of the present invention.

FIG. 2 is a configuration diagram of the semiconductor device 110 in accordance with an embodiment of the present invention.

Referring to FIG. 2, the semiconductor device 110 may include input pins 101, input/output pins 102, a data path selection unit 201, a command shifting unit 202, a parity unit 210, a register unit 220, a command decoder 230, a mode setting unit 240, an internal unit 250, and a data conversion unit 260.

The parity unit 210 may check the parity of the CA signals CA<0:22> inputted through the input pins 101 to determine whether the CA signals CA<0:22> are corrupted during the transmission, and generate a parity dock PAR_CLK. The nCr code check, the cycle redundancy check and the like may be applied as the corruption check instead of the parity check.

The parity unit 210 may check whether the number of values of '1' in the received CA signals CA<0:22> is even or odd. At this time, whether the number is even or odd may be determined according to the logic value of a parity bit PAR. For example, when the parity bit PAR is '0', the parity unit 210 may perform an even check for checking whether the number of values of '1' is even. Furthermore, when the parity bit PAR is '1', the parity unit 210 may perform an odd check for checking whether number of values of '1' is odd.

The parity unit 210 may activate the parity clock PAR_CLK when the CA signals CA<0:22> contain an error, and deactivate the parity clock PAR_CLK when the CA signals CA<0:22> contain no errors. For example, when performing an even check, the parity unit 210 may deactivate the parity dock PAR_CLK when the number of values of '1' in the received CA signals CA<0:22> is even, and activate the parity dock PAR_CLK when the number of '1's is odd. Furthermore, when performing an odd check, the parity unit 210 may deactivate the parity dock PAR_CLK when the number of values of '1' in the received CA signals CA<0:22> is odd, and activate the parity dock PAR_CLK when the number of '1s' is even. The parity unit 210 may output a parity state PAR_STATE as '0' when there is no error, and output the parity state PAR_STATE as '1' when there is an error. For reference, the parity unit 210 may include an XOR gate for performing an XOR operation on input signals.

The register unit 220 may include a plurality of mufti-purpose registers MPR0 to MPR31. The operation timings of the multi-purpose registers MPR0 to MPR31 may be set between the semiconductor device 110 and a controller (not illustrated) for controlling the semiconductor device 110, and us d for a training operation for reducing skew.

For example the multi-purpose registers MPR0 to MPR31 may store data patterns with values that are previously defined. When a read command RD is applied in an MPR mode, the semiconductor device 110 may continuously output predetermined pattern data such as '10101010', stored in the multi-purpose registers MPR0 to MPR31. The controller may receive the data outputted from the semiconductor device 110, and adjust the operation timings of the semiconductor device 110 and the controller. For reference the MPR mode may indicate an operation mode for accessing the multi-purpose registers MPR0 to MPR31 in the semiconductor device 110.

When the parity dock PAR_CLK is activated, which means that the CA signals CA<0:22> have an error, the register unit 220 may store the CA signals CA<0:22> and the parity state PAR_STATE of value '0' in the multi-purpose registers MPR to MPR31.

When a read command RD is applied in the MPR mode, the register unit 220 may output the data MPR_DATA stored in the multi-purpose registers MPR0 to MPR31 outside of the semiconductor device 110 through the input/output pins 102.

The semiconductor device 110 may perform the parity check during a normal operation, and perform a command conveyed through the CA signals CA<0:3> when there is no error. For example, when the semiconductor device 110 is a memory device, the semiconductor device 110 may perform an operation corresponding to a command represented by the CA signals CA<0:3>, on a memory cell designated through the CA signals CA<4:22>. The operation may include a data read operation, a data write operation and the like. The semiconductor device 110 may perform the parity check during the normal operation, and stop an operation without performing a command represented by the CA signals CA<0:3>, when there is an error.

Hereafter, a method of performing an OS test for the input pins 101 for receiving CA signals CA<0:22> using the function test device 120 will be described. The input pins 101 will be hereafter referred to as CA input pins 101.

The function test device 120 may generate the CA signals CA<0:22> and the parity bit PAR during the OS test. The CA signals CA<0:22> and the parity bit PAR may be applied to the semiconductor device 110 through the CA input pins 101 of the semiconductor device 110. In accordance with an embodiment of the present invention, the function test device 120 may generate the CA signals CA<0:22> and the parity bit PAR such that the number of values of '1' in the CA signals CA<0:22> does not correspond to the logic value of the parity bit PAR. At this time, the function test device 120 may store the CA signals CA<0:22> which are to be applied to the semiconductor device 110.

For example, the function test device 120 may generate a parity bit PAR of '0', which represents the even parity check, when the number of values of '1' in the CA signals CA<0:22> is odd, and generate a parity bit PAR of which represents the odd parity check, when the number of values of '1' in the CA signals CA<0:22> is even. Then, the function test device 120 may transmit the generated parity bit PAR to the semiconductor device 110.

When the CA input pins 101 are properly coupled, an error is detected by the parity unit 210 at all times. Thus, the register unit 220 may store the CA signals CA<0:22> and the parity state PAR_STATE in the multi-purpose registers MPR0 to MPR21. At this time, the parity state PAR_STATE may be stored as '1'.

Then, the function test device 120 may receive the CA signals CA<0:22> and the parity state PAR_STATE, stored in the multi-purpose registers MPR0 to MPR31, through the input/output pins 102 in the MPR mode. The function test device 120 may determine whether the CA input pins 101 are properly coupled, by referring to the parity state PAR_STATE transmitted from the semiconductor device 110 and a comparison result between the CA signals CA<0:22> stored in the function test device 120 and the CA signals CA<0:22> transmitted from the semiconductor device 110. According to the parity state PAR_STATE and the comparison result for the CA signals, the following OS test result may be obtained. Hereafter, the CA signals stored in the function test device 120 may be represented by CA1<0:22>, and the CA signals outputted from the semiconductor device 110 may be represented by CA2<0:22>.

(1) When the parity state PAR_STATE is '1' and the respective bits of the CA signals CA1<0:22> coincide with the respective bits of the CA signals CA2<0:22>, it may indicate that the CA input pins 101 are properly coupled. Thus, the OS test result for the semiconductor device 110 is determined to pass. When the respective bits of the CA signals CA1<0:22> are equal to the respective bits of CA2<0:22>, it may indicate that the CA signals CA<0:22> generated through the function test device 120 were properly transmitted to the semiconductor device 110 through the CA input pins 101.

(2) When the parity state PAR_STATE and an even number of bits do not coincide among the respective bits of the CA signals CA1<0:22> and the respective bits of the CA signals CA2<0:22>, it may indicate that coupling defects occurred in CA input pins 101 corresponding to the bits which do not coincide. Thus, the OS test result for the semiconductor device 110 may be determined as a fail. The even numbered different bits do not change oddness or evenness of values of '1' in the CA signals CA<0:22>. Thus, the parity state PAR_STATE becomes '1'.

(3) When the parity state PAR_STATE is "0", it may indicate that coupling defects occurred in an odd number of CA input pins 101, regardless of any coincidence between the CA signals CA1<0:22> and CA2<0:22>. Thus, the OS test result for the semiconductor device 110 may be determined as a fail. Further, when odd numbered different bits change the oddness or evenness of values of '1', the CA signals CA<0:22> are changed from even to odd. Thus, the parity state PAR_STATE becomes '0'.

The command shifting unit 202 may shift the signals CA<0:3> in the CA signals corresponding to a command by a time required for the parity unit 210 to perform a parity check, in synchronization with a clock CLK. This time may be referred to the parity latency (PL).

The command decoder 230 may decode the CA signals CA_PL<0:3> shifted by the command shifting unit 202, and generate internal commands MRS, ACT, PRE, RD, and WT. The internal command may include a mode register set command MRS, an active command ACT, a precharge command PRE, a read command RD, a write command WT and the like. The semiconductor device 110 may perform operations corresponding to the activated internal commands MRS, ACT, PRE, RD, and WT. The command decoder 230 may activate an internal command corresponding to a combination of the CA signals CA_PL<0:3> among the internal commands MRS, ACT, PRE, RD, and WT, and stop the generation of the internal commands MRS, ACT, PRE, RD, and WT when the parity clock PAR_CLK is activated. MRS may represent a mode register set command, ACT may represent an active command, PRE may represent a precharge command, RD may represent a read command, and WR may represent a write command.

The mode setting unit 240 may set the MPR mode using the CA signals CA<4:22> when the mode register set command MRS is activated. The mode setting unit 240 may generate a mode signal MPR, and deactivate the mode signal MPR when the MPR mode is not set or activate the mode signal MPR when the MPR mode is set.

The internal unit 250 may perform a predetermined operation in response to the internal commands ACT, PRE, RD, and WT and the CA signals CA<4:22>. For example, when the semiconductor device 110 is a memory device, the internal unit 250 may include a plurality of memory cells (not illustrated in FIG. 2), and activate a word line (not illustrated in FIG. 2) designated by the CA signals CA<4:22> in response to the active command ACT. The internal unit 250 may write data DATA inputted through the input/output pins 102 to selected memory cells when the write command WT is applied when the word line is activated, and output data of selected memory cells to the outside of the semiconductor device 110 through the input/output pins 102 when the RD command is applied.

The data path selection unit 201 may control a data path such that data is transmitted between the internal unit 250 and the input/output pins 102 when the MPR mode is not set, or data is transmitted between the register unit 220 and the input/output pins 102 when the MPR mode is set.

The data conversion unit 260 may perform serial-to-parallel conversion to the data inputted to the input/output pins 102 and load the converted data to global buses GIO>0:63>, or parallel-to-serial conversion to data of the global buses GIO<0:63> and output the converted data to the input/output pins 102.

The semiconductor system of FIG. 1 and the semiconductor device 110 of FIG. 2 may perform an OS test for the CA input pins 101 through the function test device 120 which is capable of performing only a function test using the parity unit 210 and the register unit 220 of the semiconductor device 110. Thus, the fabrication time and cost of the semiconductor device 110 can be reduced.

Figure 3:
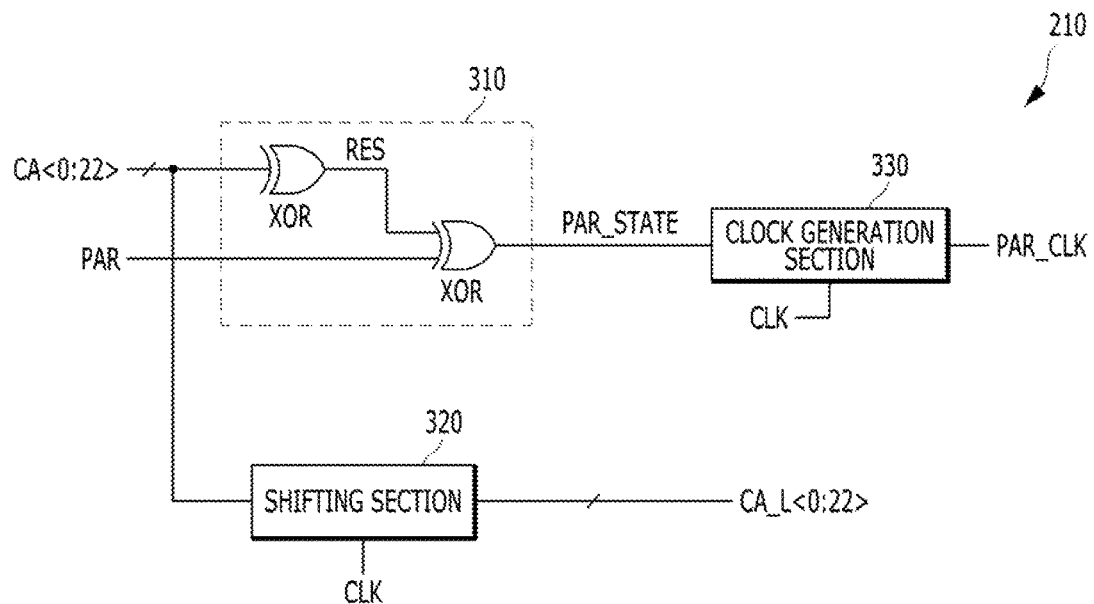
FIG. 3 is a configuration diagram of a parity unit shown in FIG. 2.

FIG. 3 is a configuration diagram of the parity unit 210.

Referring to FIG. 3, the parity unit 210 may include a parity check unit 310, a shifting unit 320, and a clock generation unit 330.

The parity check unit 310 may determine whether the number of values of '1' in the CA signals CA<0:22> is odd or even, and detect whether the determination result RES corresponds to the logic value of the parity bit PAR. The parity check unit 310 may perform an XOR operation on the CA signals CA<0:22>. The determination result RES may become '1' when the number of values of '1' in the CA signals CA<0:22> is odd, or '0' when the number of '1s' is even.

Thus, when the parity bit PAR is '1' (odd check), the parity state PAR_STATE may become '0' when the number of values of '1' in the CA signals CA<0:22> is odd, or '1' when the number of signals is even. Furthermore, when the parity bit PAR is '0' (even check), the parity state PAR_STATE may become '1' when the number of values of '1' in the CA signals CA<0:22> is odd, or '0' when the number of signals is even.

The shifting unit 320 may shift the CA signals CA<0:22> by a time required for the parity check unit 310 to perform a parity check, in synchronization with the clock CLK, and output the shifted signals as CA signals CA_L<0:22>.

The clock generation unit 330 may generate a parity clock PAR_CLK, and transmit the clock CLK as the parity clock PAR_CLK during a predetermined period when the parity state PAR_STATE is '1' or not transmit the dock CLK as the parity dock PAR_CLK when the parity state PAR_STATE is '0'. Thus, the parity dock PAR_CLK may be activated during the predetermined period when the parity state PAR_STATE is '1', or deactivated when the parity state PAR_STATE is '0'.

Figure 4:
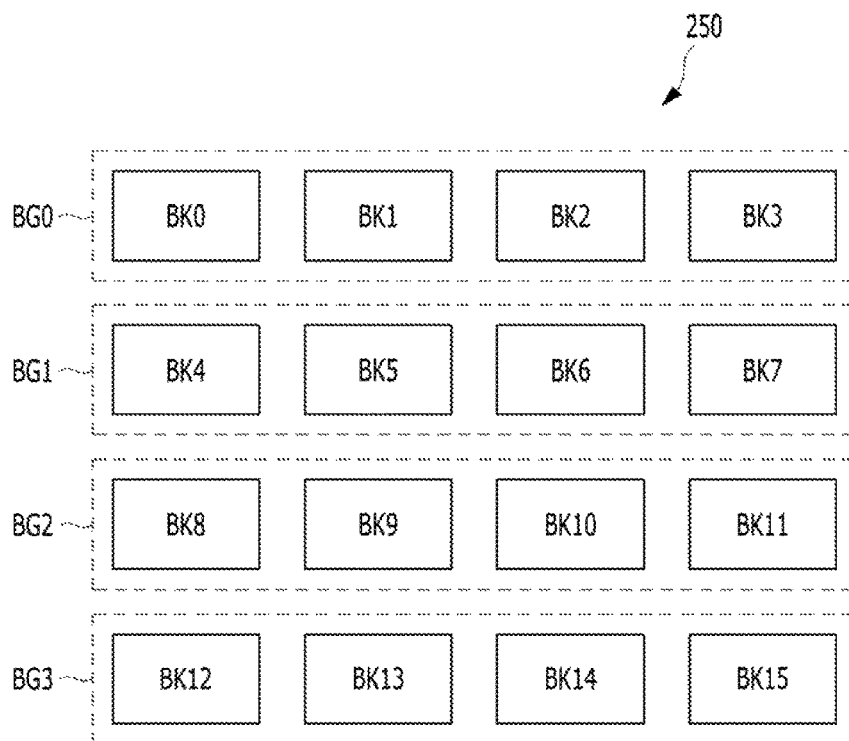
FIG. 4 is a configuration diagram of an internal unit shown in FIG. 2.

FIG. 4 is a configuration diagram of the internal unit 250.

Referring to FIG. 4, the internal unit 250 may include a plurality of bank groups BG0 to BG3 each including a plurality of banks BK0 to BK15. Each of the banks BK0 to BK15 may include a plurality of memory cells (not illustrated in FIG. 4) for storing data.

The semiconductor device 110 may write or read data to or from memory cells selected by the address signals CA<4:22> during a data read or write operation. A bank group to be accessed among the plurality of bank groups BG0 to BG3 may be selected by the bank group address signals CA<4:5>. A bank to be accessed among the plurality of banks BK0 to BK15 within the selected bank group may be selected by the bank address signals CA<6:7>. Memory cells to be accessed among the plurality of memory cells within the selected bank may be selected by the address signal CA<8:22>.

Figure 5:
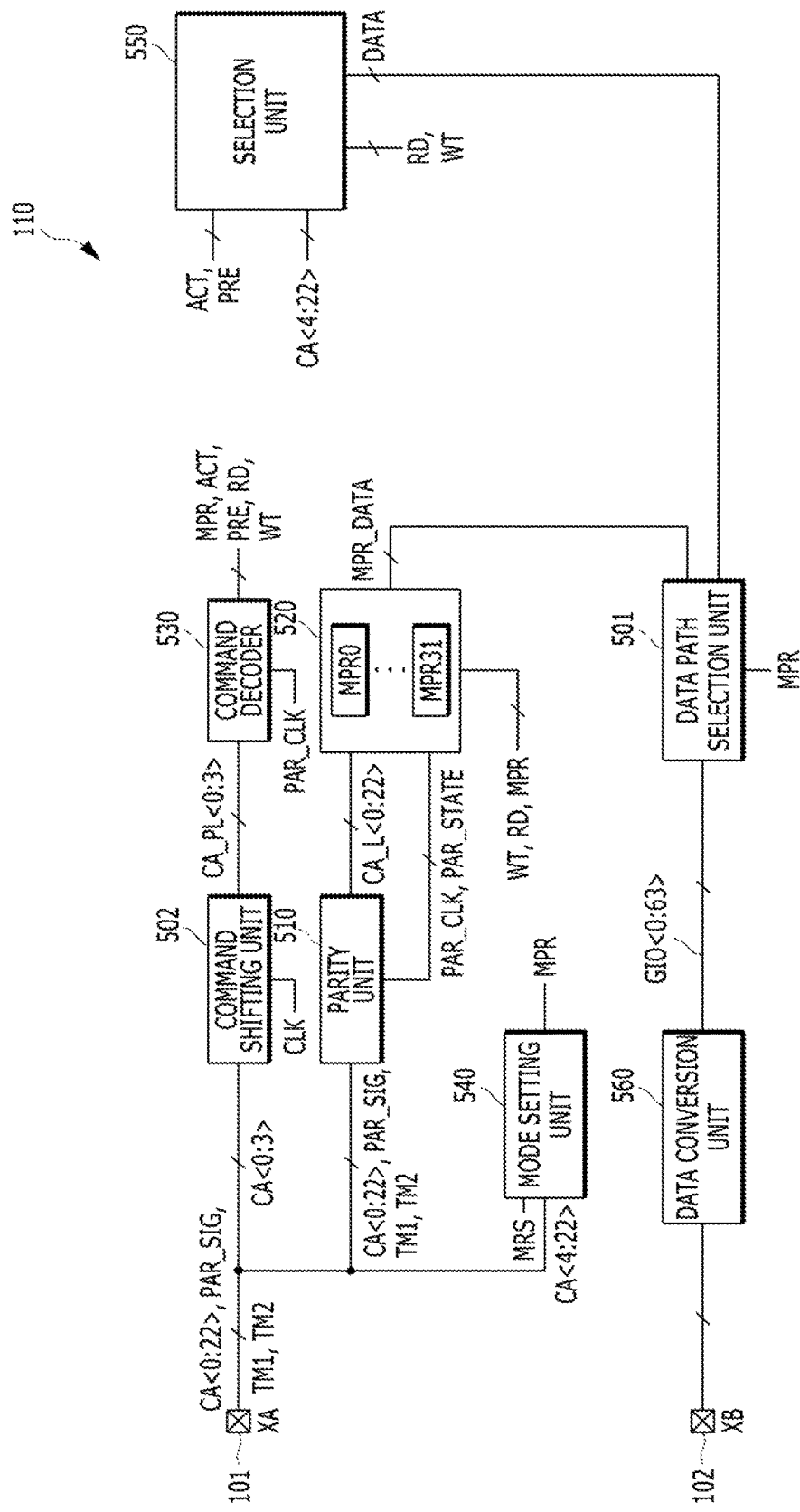
FIG. 5 is a configuration diagram of a semiconductor device in accordance with another embodiment of the present invention.

FIG. 5 is a configuration diagram of the semiconductor device 110 in accordance with another embodiment of the present invention.

Referring to FIG. 5, the semiconductor device 110 may include input pins 101, input/output pins 102, a data path selection unit 501, a command shifting unit 502, a parity unit 510, a register unit 520, a command decoder 530, a mode setting unit 540, and an internal unit 550. The semiconductor device 110 of FIG. 5 may further include an input pin 101 for applying one or more test signals TM1 and TM2, unlike the semiconductor device of FIG. 2.

The semiconductor device 110 of FIG. 5 may perform an even or odd parity check of the CA signals CA<0:22> according to signals PAR_SIG, TM1, and TM2 inputted through the input pins 101, and the function test device 120 may control an even check or odd check using the test signals TM1 and TM2 during the function test. The signal PAR_SIG may represent the number of values of '1' in the CA signals CA<0:22>. During the function test operation, the input pin 101 through which the signal PAR_SIG is inputted may not be used but floated. The command shifting unit 502, the register unit 520, the command decoder 530, the mode setting unit 540, and the internal unit 550 may be configured and operated in the same manner as those described with reference to FIGS. 2 to 4.

Figure 6:
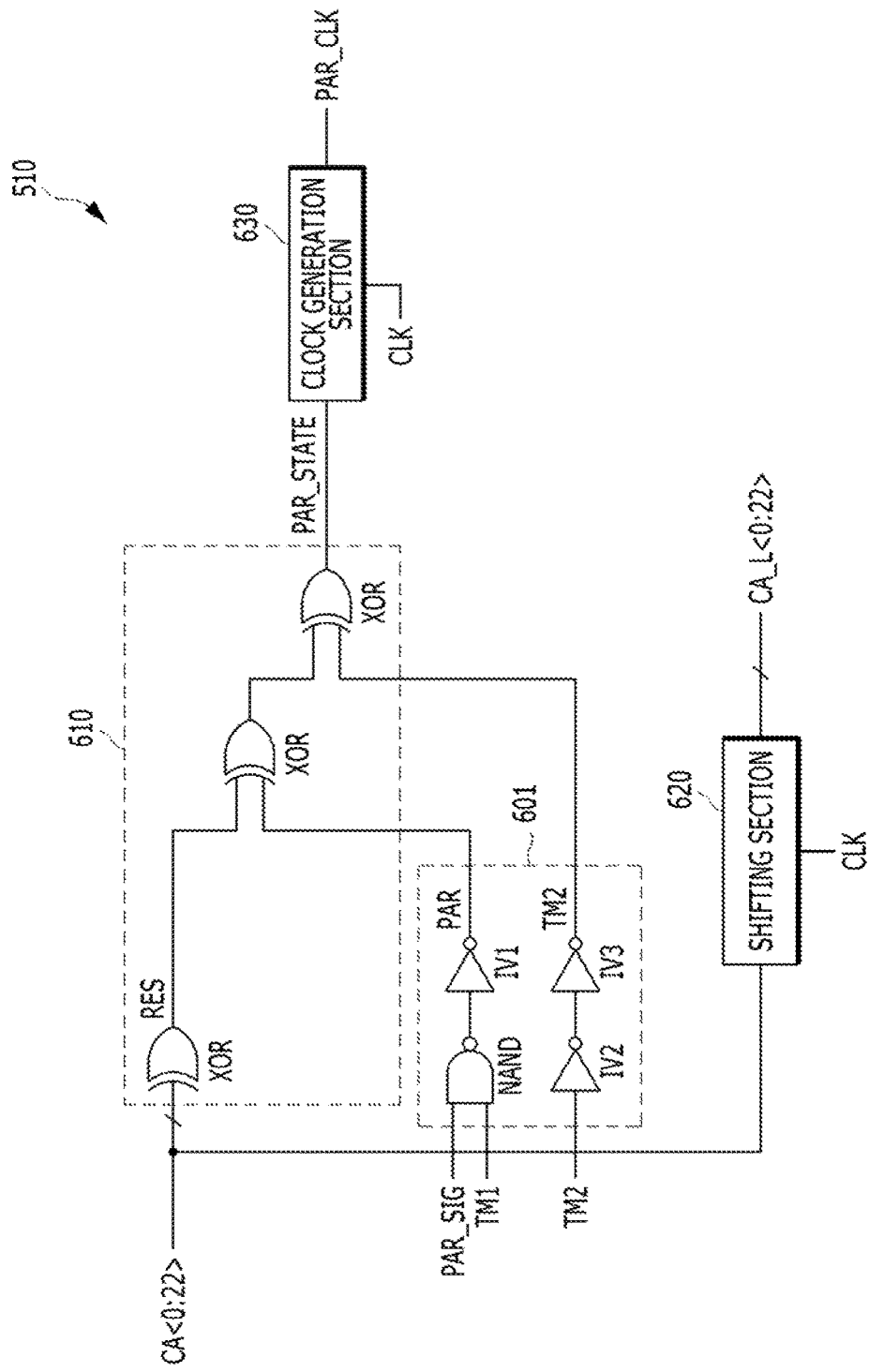
FIG. 6 is a configuration diagram of a parity unit shown in FIG. 5.

FIG. 6 is a configuration diagram of the parity unit 510.

Referring to FIG. 6, the parity unit 510 may include a parity control section 601, a parity check section 610, a shifting section 620 and a clock generation section 630. The parity control section 601 may include a NAND gate NAND and inverters IV1 to IV3. The shifting section 620 and the clock generation section 630 may be configured and operated in the same manner as those described with reference to FIG. 3.

The parity check section 610 may determine whether the number of values of '1' in the CA signals CA<0:22> is odd or even, and detect whether the determination result RES corresponds to the logic value of combination of the signals PAR_SIG, TM1, and TM2. The parity check unit 310 may perform an XOR operation on the CA signals CA<0:22>. The determination result RES may become '1' when the number of values of '1' in the CA signals CA<0:22> is odd, or '0' when the number of signals is even.

Furthermore, the parity check section 610 may determine the logic value of the parity state PAR_STATE by performing an XOR operation on a signal PAR, the test signal TM2, and the determination result RES. The signal PAR may be obtained by performing an AND operation on the signals PAR_SIG and TM1. The test signal TM1 may fix the signal PAR to '0' during the function test. Although the signal PAR_SIG floats during the function test, the signal PAR may become '0' when the test signal TM1 is '0'. When the test signal TM2 is '0', the parity check section 610 may perform an odd check. When the test signal TM2 is '1', the parity check section 610 may perform an even check.

During the function test, the function test device 120 may generate the test signals TM1 and TM2 having values of '0', and the CA signals CA<0:22> such that the number of values of '1' in the CA signals CA<0:22> is even. During the function test, the function test device 120 may generate the test signals TM1 and TM2 respectively having values of '0' and '1', and the CA, signals CA<0:22> such that the number of values of '1' in the CA signals CA<0:22> is odd.

The semiconductor device 110 of FIG. 5 may perform a test in the same manner as the semiconductor device 110 of FIG. 2, and perform an OS test using a function test.

Figure 7:
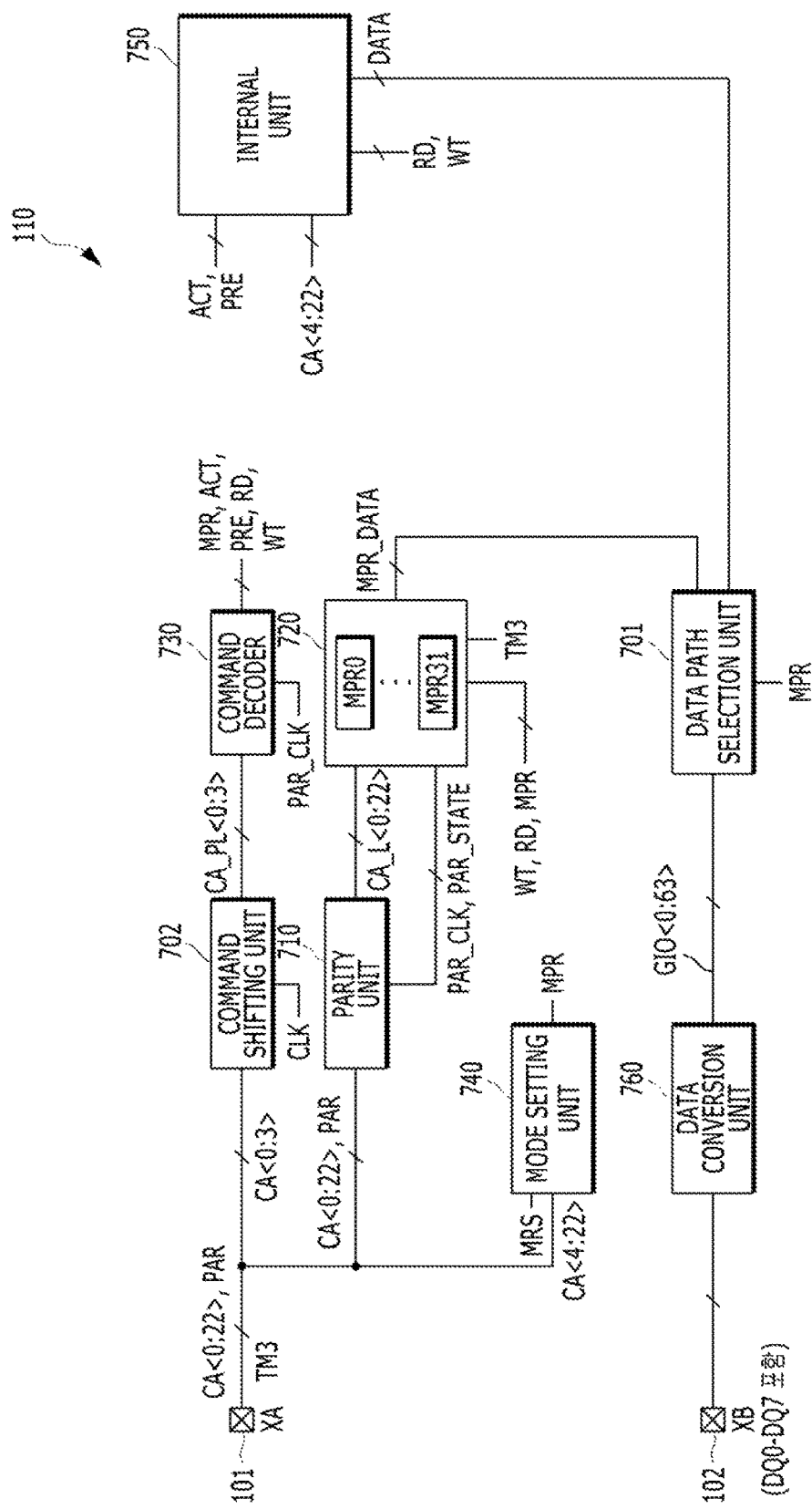
FIG. 7 is a configuration diagram of a semiconductor device in accordance with another embodiment of the present invention.

FIG. 7 is a configuration diagram of a semiconductor device 110 in accordance with another embodiment of the present invention.

Referring to FIG. 7, the semiconductor device 110 may include input pins 101, input/output pins 102, a data path selection unit 701, a parity unit 710, a register unit 720, a command decoder 730, a mode setting unit 740, an internal circuit 740, and a data conversion unit 750. The semiconductor device 110 of FIG. 7 may perform the OS test on the CA input pins 101 using the function test for controlling the register unit 720.

The CA signals CA<0:22> may be divided into first and second groups. The first group may include an active command signal CA<0>, a row address strobe signal CA<1>, a write enable signal CA<3>, a bank address signal CA<6:7>, and 11th and 12th address signals CA<19:20>. The second group may include a column address strobe signal CA<2>, a bank group address signal CA<4:5>, and zeroth to tenth, 13th, and 17th address signals CA<8:18> and CA<21:22>. The first group may include the CA signals CA<0:2> CA<3>, CA<6:7>, and CA<19:20> which are used for controlling the operation of the register unit 220 and the second group may include the CA signals CA<2>, CA<4:5>, CA<8:18>, and CA<21:22> which are not used for controlling the operation of the register unit 220. The reason why the CA signals are divided into two groups to perform an OS test may be described as follows.

The CA signals of the first group may be used for controlling the operation of the register unit 220. Thus, it is possible to determine whether the CA input pins 101 of the first group are properly coupled by confirming that the register unit 220 performed an expected operation in response the CA signals of the first group applied to the register unit 220. In other words, when the register unit 220 performed the expected operation corresponding to the CA signals of the first group provided to the semiconductor device 110, it may indicate that the CA input pins 101 of the first group are properly coupled. When the register unit 220 did not perform the expected operation corresponding to the CA signals of the first group provided to the semiconductor device 110, it may indicate that the CA input pins 101 of the first group are not properly coupled.

On the other hand, since the CA signals of the second group are not used for controlling the operation of the register unit 220, whether the CA input pins 101 of the second group are properly coupled cannot be determined through the same method as the CA signals of the first group. In this case, the function test device 120 may apply the CA signals of the second group to the semiconductor device 110, and store the provided CA signals, and the semiconductor device 110 may store the received CA signals of the second group in the multi-purpose registers MPR0 to MPR31 and output the stored CA signals to the function test device. Then, the function test device 120 may compare the CA signals of the second group, which are outputted from the semiconductor device 110, with the CA signals of the second group, which are stored in the function test device 120, and determine whether the CA input pins 101 of the second group are properly coupled.

Hereafter, which operations are controlled by the CA signals CA<0:2>, CA<3>, CA<6:7>, and CA<19:20> of the first group and how the OS test for the CA input pins 101 of the first group is performed during the function test will be described as follows.

The mode register set command MRS may be activated when the CA signals CA<0:3> of which only CA<0> is '1' and CA<1:3> are '0' are applied. Thus, the function test device 120 may apply the CA signals CA<0:3> as '1000', and check whether the semiconductor device 110 properly performed MRS setting, thereby detecting whether the input pin 101 of the CA signal CA<0> is properly coupled.

The write command WT may be activated when the CA signals CA<0:3> are '1100'. Thus, the function test device 120 may apply the CA signals CA<0:3> as '1100' in the MPR mode, and check whether data are properly written to the multi-purpose registers MPR0 to MPR31, thereby detecting whether the input pin 101 of the CA signal CA<1> is properly coupled.

The read command RD may be activated when the CA signals CA<0:3> are '1101'. Thus, the function test device 120 may apply the CA signals CA<0:3> as '1101' in the MPR mode, and check whether data of the multi-purpose registers MPR0 to MPR31 are properly read, thereby detecting whether the input pin 101 of the CA signal CA<3> is properly coupled.

The bank address signal CA<6:7> is a signal for selecting multi-purpose registers to read/write data, among the plurality of multi-purpose registers MPR0 to MPR31. For example, when the bank address signal CA<6:7> is '00', '10', '01', and '11', the multi-purpose registers MPR0 to MPR7, MPR8 to MPR15, MPR16 to MPR23, and MPR24 to MPR31 may be respectively selected. When the semiconductor device 110 is reset, the multi-purpose registers MPR0 to MPR31 may be reset to store specific values. For example, the multi-purpose registers MPR0 to MPR7, MPR8 to MPR15, MPR16 to MPR23, and MPR24 to MPR31 may be set to store '10101010', '11001100', '11110000', and '00000000', respectively. Thus, when reading and checking the data of the multi-purpose registers while changing values of the bank address signal CA<6:7> the function test device 120 may check whether proper multi-purpose registers were selected according to the value of the bank address signal CA<6:7>, thereby detecting whether the input pins 101 of the bank address signal CA<6:7> are properly coupled.

The 11th and 12th address signals CA<19:20> may be used to select an output mode of the data stored in the mufti-purpose registers MPR0 to MPR31. The data stored in the mufti-purpose registers MPR0 to MPR31 may be outputted through the input/output pins 102. At this time, suppose that the data of the multi-purpose registers MPR0 to MPR31 can be outputted through eight input/output pins 102. Furthermore, suppose that the eight input/output pins are represented by DQ0 to DQ7 and values stored in the selected multi-purpose registers MPR0 to MPR7 are '01111111'.

In a first mode in which the 11th and 12th address signals CA<19:20> are '00', the data stored in the selected mufti-purpose registers MPR0 to MPR7 may be serially outputted to the input/output pins DQ0 to DQ7. That is, '01111111' may be serially outputted to each of the input/output pins DQ0 to DQ7. In a second mode in which the 11th and 12th address signals CA<19:20> are '10', the data stored in the selected multi-purpose registers MPR0 to MPR7 may be outputted to the corresponding input/output pins DQ0 to DQ7. That is, '0' may be outputted to the input/output pin DQ0, and '1' may be outputted to the input/output pins DQ1 to DQ7. In a third mode in which the 11th and 12th address signals CA<19:20> are '01', the data of the multi-purpose registers MPR0 to MPR31 may be serially outputted through the corresponding input/output pins 102. For example, when it is assumed that '10101010', '11001100', '11110000' and '00000000' are stored in the multi-purpose registers MPR0 to MPR7, MPR8 to MPR15, MPR16 to MPR23, and MPR24 to MPR31, respectively, '10101010' may be serially outputted through the input/output pin DQ0, '11001100' may be serially outputted through the input/output pin DQ1, '11110000' may be serially outputted through the input/output pin DQ2, and '00000000' may be serially outputted through the input/output pin DQ3.

Thus, when reading and checking the data of the multi-purpose registers while changing values of the 11th and 12th address signals CA<19:20>, the function test device 120 may check whether proper multi-purpose registers were selected according to the values of the 11th and 12th address signals CA<19:20>, thereby detecting whether the input pins 101 of the 11th and 12th address signals CA<19:20> are properly coupled.

Hereafter, how the OS test for the CA input pins 101 of the second group is performed during the function test will be described. At this time, a method of performing the OS test using only the multi-purpose registers MPR0 to MPR7 among the plurality of registers MPR0 to MPR31 will be described as follows.

Since the number of the CA signals CA<2>, CA<4:5>, CA<8:18>, and CA<21:22> of the second group is 16 and the number of the multi-purpose registers MPR0 to MPR7 used for the function test is 8, the OS test for the CA input pins 101 of the second group may be completed by writing or reading data to or from the multi-purpose registers MPR0 to MPR7 twice. At this time, the CA signals stored in the multi-purpose registers MPR0 to MPR7 may be selected according to a test signal TM3. The test signal TM3 may be inputted to the semiconductor device 110 from the function test device 120 through the input pins 101 which is separately formed in the semiconductor device 110.

First, when the test signal TM3 is '0', the register unit 720 may store the CA signals CA<2>, CA<4:5>, and CA<8:12> in the multi-purpose registers MPR0 to MPR7 through a write operation. Then, the function test device 120 may compare the CA signals CA<2>, CA<4:5>, and CA<8:12> outputted from the multi-purpose registers MPR0 to MPR7 through a read operation to the CA signals stored in the function test device 120, and detect whether the input pins 101 of the CA signals CA<2>, CA<4:5>, and CA<8:12> are properly coupled.

Then, when the test signal TM3 is '1', the register unit 720 may store the CA signals CA<13:18> and CA<21:22 in the multi-purpose registers MPR0 to MPR7 through a write operation. Then, the function test device 120 may compare the CA signals CA<13:18> and CA<21:22> outputted from the multi-purpose registers MPR0 to MPR7 through a read operation to the CA signals stored in the function test device 120, and detect whether the input pins 101 of the CA signals CA<13:18> and CA<21:22> are properly coupled.

The data conversion unit 750 may perform serial-to-parallel conversion to the data inputted to the input/output pins 102 and load the converted data to the global buses GIO<0:63>, serial conversion to data of the global buses GIO<0:63> and output the converted data to the input/output pins 102.

The semiconductor system of FIG. 1 and the semiconductor device 110 of FIG. 7 may perform the OS test for the CA input pins 101 through the function test device 120 which is capable of performing only the function test using the register unit 720 of the semiconductor device 110. Thus, fabrication time and cost can be reduced.

Figure 8:
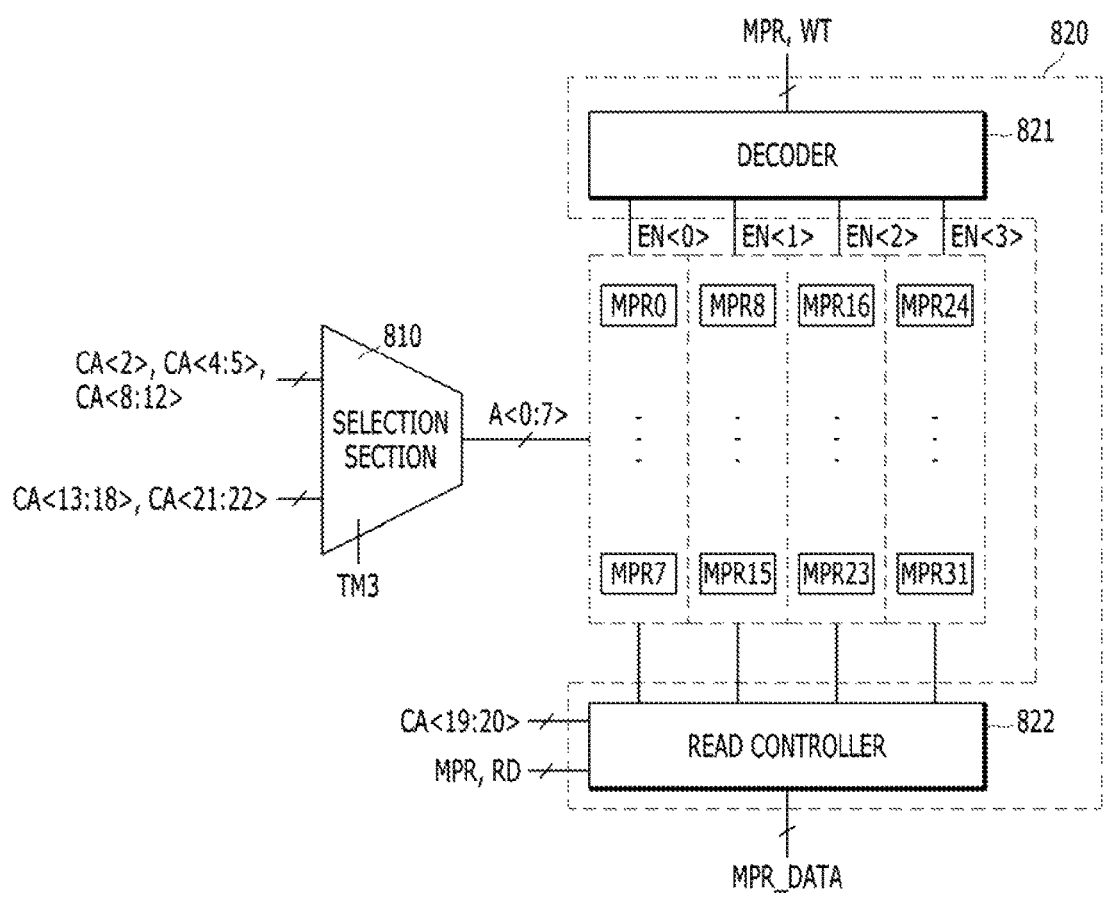
FIG. 8 is a configuration diagram of a register unit shown in FIG. 7.

FIG. 8 is a configuration diagram of the register unit 720.

Referring to FIG. 8, the register unit 720 may include multi-purpose registers MPR0 to MPR31, a selection section 810, and a register control section 820. The register control section 820 may include a decoder 821 and a read controller 822.

The selection section 810 may select a part of the CA signals CA<2>, CA<4:5>, CA<8:18>, and CA<21:22> of the second group in response to the test signal TM3, and transmit the selected signals to the multi-purpose registers MPR0 to MPR31 through the input lines A<0:7>. The selection section 810 may select the CA signals CA<2>, CA<4:5> and CA<8:12> and transmit the selected signals to the input lines A<0> to A<7> when the test signal TM3 is '0', or select the CA signals CA<13:18> and CA<21:22> and transmit the selected signals to the input lines A<0> to A<7> when the test signal TM3 is '1'.

The register unit 720 may read/write data from/to the multi-purpose registers MPR0 to MPR31 in the MPR mode in which the MPR signal is activated. The decoder 821 may decode the bank address signal CA<4:5>, and activate one select signal corresponding to the value of the bank address signal CA<4:5> among select signals EN<0:3>. When the write command WT is activated in the MPR mode, the signals transmitted to the input lines A<0:7> may be stored in selected multi-purpose registers. For example, when the bank address signal CA<4:5> is '00', the select signal EN0 may be activated. When the write command WT is activated in the MPR mode, the signals of the input lines A<0> to A<7> may be stored in the multi-purpose registers MPR0 to MPR7.

When the read command RD is activated in the MPR mode, the read controller 822 may transmit the data of the multi-purpose registers MPR0 to MPR31 to the global buses GIO<0:63> according to an output mode set through the 11th and 12th address signals CA<19:20>. The data of the global buses GIO<0:63> may be outputted to the outside of the semiconductor device 110 through the input/output pins 102.

Figure 9:
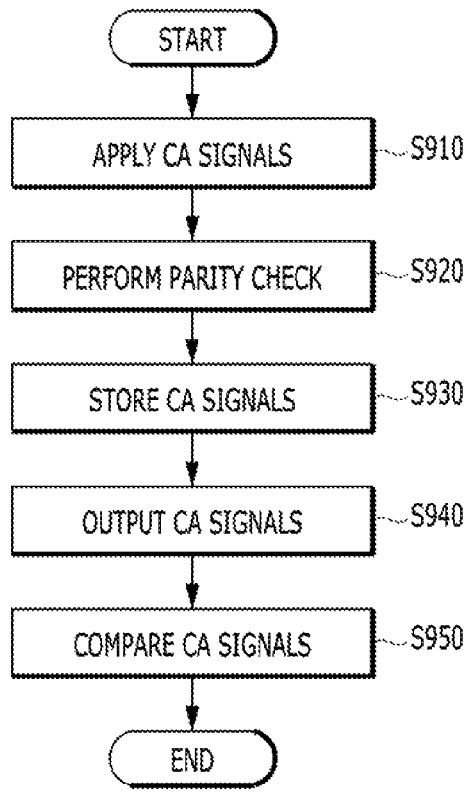
FIG. 9 is a flowchart for describing a method for testing a semiconductor device in accordance with an embodiment of the present invention.

FIG. 9 is a flowchart for describing a method for testing a semiconductor device in accordance with an embodiment of the present invention. The method for testing a semiconductor device in FIG. 9 may include a test method using the semiconductor device 110 of FIG. 2 or 5.

Referring to FIG. 9, the method for testing a semiconductor device may include a CA signal application step S910, a parity check step S920, a CA signal storage step S930, a CA signal output step S940, and a signal comparison step S950.

At the CA signal application step S910, the function test device 120 may apply CA signals CA<0:22> to the semiconductor device 110. As described above with reference to FIG. 2, the function test device 120 may directly generate the CA signals CA<0:22> and a parity bit PAR such that the number of values of '1' in the CA signals CA<0:22> does not correspond to the parity bit PAR, and apply the CA signals CA<0:22> and the parity bit PAR to the semiconductor device 110. On the other hand, as described above with reference to FIG. 5, the function test device 120 may generate the CA signals CA<0:22> having predetermined numbers of values of '1' and the signals PAR_SIG, TM1, and TM2 such that semiconductor device 110 of FIG. 5 performs either an even or odd parity check of the CA signals CA<0:22>, the result of which is a fail, through the combination of the signals PAR_SIG, TM1, and TM2.

At the parity check step S920, the function test device 120 may perform a parity operation for the CA signals CA<0:22> and generate a parity clock PAR_CLK and a parity state PAR_STATE. For reference, when the CA input pins 101 are properly coupled, the parity clock PAR_CLK may be activated, and the parity state PAR_STATE may become '1'.

When the parity dock PAR_CLK is activated and the parity state PAR_STATE becomes '1' as the parity check result, the CA signals CA<0:22> may be stored in the multi-purpose registers MPR0 to MPR3 at the CA signal storage step S930.

At the CA signal output step S940, the parity state PAR_STATE and the CA signals CA<0:22> stored in the multi-purpose registers MPR0 to MPR3 may be output externally. The outputted CA signals CA<0:22> may be inputted to the function test device 120.

At the signal comparison step S950, the function test device 120 may compare the CA signals CA<0:22> stored therein to the CA signals CA<0:22> output from the semiconductor device 110, and detect whether the CA input pins 101 are properly coupled.

Figure 10:
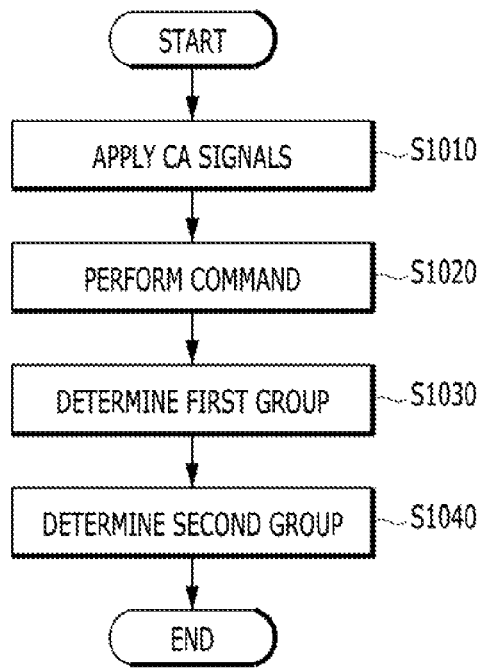
FIG. 10 is a flowchart for describing a method for testing a semiconductor device in accordance with an embodiment of the present invention.

FIG. 10 is a flowchart for describing a method for testing a semiconductor device in accordance with an embodiment of the present invention. The method for testing a semiconductor device in FIG. 10 may include a test method using the semiconductor device 110 of FIG. 7.

Referring to FIG. 10, the method for testing a semiconductor device may include a CA signal application step S1010, a command performance step S1020, a first group determination step S1030, and a second group determination step S1040.

At the CA signal application step S1010, CA signals CA<0:22> may be applied to the function test device 120. At this time, the CA signals may include a combination for performing the MRS mode, combination for performing a write operation, a combination for performing a read operation, a combination for selecting a part of the mufti-purpose registers MPR0 to MPR31, and a combination for selecting an output mode of data stored in the multi-purpose registers MPR0 to MPR31.

At the command performance step S1020, the semiconductor device 110 may perform an operation corresponding to a combination of CA signals of the first group among the CA signals applied at the CA signal application step S1010. At the first group determination step S1030, the function test device 120 may perform an OS test for the CA input pins of the first group by detecting whether the semiconductor device 110 properly performed a command at the command performance step S1020.

At this time, the command performance step S1020 may include storing CA signals of the second group in the multi-purpose registers MPR0 to MPR31, and outputting the stored CA signals. At the second group determination step S1040, the function test device 120 may perform an OS test for the CA input pins of the second group by comparing the CA signals stored therein to the CA signals of the second group, outputted at the command performance step S1020.

According to whether the OS tests for all the CA input pins were completed after the second group determination step S1040, the procedure may be ended, or the steps S1010 to 1040 may be repeated.

In accordance with the embodiments of the present invention, the semiconductor system and the method for testing a semiconductor device may perform the OS test for the input/output pins of the semiconductor device using the package function test device which performs the function test for the semiconductor device including the multi-purpose registers.

FIGS. 11A and 11B are diagrams for describing an OS test operation for data input/output pins of a semiconductor device in accordance with an embodiment. Hereafter, an OS test operation for data input/output pins DQ0 to DQ7 in case where the number of input/output pins is set to 8 will be described.

The OS test operation for the input/output pins may be performed after the OS test operation for the input pins 101 in the semiconductor device of FIG. 2 or 5 was ended in case where the input pins 101 passed the OS test.

Hereafter, suppose that a value stored in multi-purpose registers MPR0 to MPR7 is 01001010. Furthermore suppose that the value is a part of CA signals which are inputted and stored in the semiconductor device in order' to perform the OS test operation for the input pins 101.

FIG. 11A is a diagram for describing an operation in case where data stored in the multi-purpose registers MPR0 to MPR7 selected among the multi-purpose registers MPR0 to MPR31 are outputted in series.

Referring to FIG. 11A, when the data are outputted in series, the data 01001010 stored in the mufti-purpose registers MPR0 to MPR7 may be outputted through each of the input/output pins DQ0 to DQ7. That is, 01001010 may be outputted to the input/output pin DQ0, 01001010 may be outputted to the input/output pin DQ1, . . . , and 01001010 may be outputted to the input/output pin DQ7.

When the data outputted to the input/output pins DQ0 to DQ7 are compared to the corresponding CA signals among the CA signals inputted to the semiconductor device during the OS test operation for the input pins 101, an OS test for the input/output pins DQ0 to DQ7 may be performed. At this time, data outputted to an input/output pin of which the OS state is normal, among the input/output pins DQ0 to DQ7, may be equal to the CA signals inputted to the semiconductor device. The data outputted to an input/output pin of which the OS state is abnormal, among the input/output pins DQ0 to DQ7, may be different from the CA signals inputted to the semiconductor device.

FIG. 11B is a diagram for describing an operation in case where the data stored in the multi-purpose registers MPR0 to MPR7 selected among the multi-purpose registers MPR0 to MPR31 are outputted in parallel.

When the data are outputted in parallel, the respective bits of the data 01001010 stored in the multi-purpose registers MPR0 to MPR7 may be outputted to the corresponding input/output pins DQ0 to DQ7, That is, 0 may be outputted to the input/output pin DQ0, 1 may be outputted to the input/output pin DQ1, 0 may be outputted through the input/output pin DQ2, 0 may be outputted to the input/output pin DQ3, 1 may be outputted to the input/output pin DQ4, 0 may be outputted to the input/output pin DQ5, 1 may be outputted to the input/output pin DQ6, and 0 may be outputted to the input/output pin DQ7.

When the data outputted to the input/output pins DQ0 to DQ7 are compared to the corresponding CA signals among the CA signals inputted to the semiconductor device during the OS test operation for the input pins 101, an OS test for the input/output pins DQ0 to DQ7 may be performed. At this time, a bit outputted to an input/output pin of which the OS state is normal, among the input/output pins DQ0 to DQ7, may be equal to the corresponding signal of the CA signals inputted to the semiconductor device. The bit outputted to an input/output pin of which the OS state is abnormal, among the input/output pins DQ0 to DQ7, may be different from the corresponding signal of the CA signals inputted to the semiconductor device.

Since the OS test method of FIG. 11A uses more various bits for each pad than the OS test method of FIG. 11B, the OS test method of FIG. 11A can obtain a better effect in terms of test accuracy. Since the OS test method of FIG. 11B outputs a smaller number of bits for each pad than the OS test method of FIG. 11A, the OS test method of FIG. 11B can obtain a better effect in terms of test speed.

Although various embodiments have been described for illustrative purposes, it will be apparent to those skilled in the art that various changes and modifications may be made without departing from the spirit and scope of the invention as defined in the following claims.

What is claimed is:

1. A semiconductor system comprising:
a semiconductor device comprising:
a plurality of first input pins;
a parity check unit configured to perform a parity check for command/address signals inputted to the plurality of first input pins, and determine a parity check result as a pass or fail;
one or more registers configured to store inputted command/address signals when the parity check result is determined as the fail, and
a function test unit configured to control a number of signals having a first logic value among the command/address signals inputted to the plurality of first input pins such that the command/address signals do not correspond to a logic value of a parity bit during a test operation.

2. The semiconductor system of claim 1, wherein when the number of signals corresponding to '1' among the inputted command/address signals is odd and the parity bit is '0' during the parity check, the parity check unit determines the parity check result as the fail, and
when the number of signals corresponding to '1' among the inputted command/address signals is even and the parity bit is '0' during the parity check, the parity check unit determines the parity check result as the pass.

3. The semiconductor system of claim 1, further comprising a second input pin configured to receive the parity bit,
wherein during the test operation, when the number of signals corresponding to '1' among the command/address signals inputted to the plurality of first input pins is odd, the parity bit inputted to the second input pin is '0', and
when the number of signals corresponding to '1' among the command/address signals inputted to the plurality of first input pins is even, the parity bit inputted to the second input pin is '1'.

4. The semiconductor system of claim 1, further comprising:
a second input pin configured to receive a parity signal;
one or more test input pins configured to receive one or more test signals; and
a parity control unit configured to generate the parity bit in response to the parity signal inputted to the second input pin and the one or more test signals inputted to the one or more test input pins,
wherein during the test operation, the number of signals having the first logic value among the command/address signals inputted to the plurality of first input pins corresponds to the logic value of the parity bit, and the one or more test signals are inputted so that the number of signals having the first logic value among the command/address signals inputted to the plurality of first input pins does not correspond to the logic value of the parity bit.

5. The semiconductor system of claim 1, wherein the semiconductor device stores the parity check result of the parity check unit in the one or more registers, and outputs data stored in the one or more registers.

6. The semiconductor system of claim 5, wherein when the parity check result included in the data outputted from the semiconductor device is the fail and the command/address signals included in the data outputted from the semiconductor device are the same as the plurality of command/address signals inputted to the plurality of first input pins, the plurality of first input pins have a normal OS (Open/Short) state, and
when the parity check result included in the data outputted from the semiconductor device is the fail and the command/address signals included in the data outputted from the semiconductor device are different from the plurality of command/address signals inputted to the plurality of first input pins or when the parity check result included in the data outputted from the semiconductor device is the pass, the plurality of first input pins have an abnormal OS state.

7. The semiconductor system of claim 6, further comprising a plurality of input/output pins for data input/output,
wherein when the OS states of the plurality of first input pins are determined to be normal, the semiconductor device outputs the respective bits of the data stored in all or part of the one or more registers to the corresponding input/output pins among the plurality of input/output pins, and tests the OS states of the plurality of input/output pins by comparing the data outputted to the plurality of input/output pins to the plurality of command address signals inputted to the plurality of first input pins.

8. The semiconductor system of claim 6, further comprising a plurality of input/output pins for data input/output,
wherein when the OS states of the plurality of first input pins are determined to be normal, the semiconductor device outputs the data stored in all or part of the one or more registers to each of the input/output pins, and tests the OS states of the plurality of input/output pins by comparing the data outputted to the plurality of input/output pins to a plurality of command address signals inputted to the plurality of first input pins.

9. A semiconductor device system comprising:
a semiconductor device comprising:
a plurality of first input pins; and
one or more registers, and
a function test unit,
wherein the semiconductor device performs one or more test operations in response to a first group of signals among a plurality of command/address signals inputted to the plurality of first input pins, the one or more test operations comprising an operation of storing a second group of signals among the plurality of command/address signals inputted to the plurality of first input pins into the one or more registers and an operation of outputting data stored in the one or more registers,
wherein the function test unit determines a test result for the plurality of first input pins according to whether the semiconductor device properly performs the one or more test operations, and determines a comparison result between the plurality of command/address signals stored therein and the plurality of command/address signals outputted from the semiconductor device.

10. The semiconductor system of claim 9, wherein when the one or more test operations are normal, one or more first input pins for receiving the first group of signals among the plurality of first input pins have a normal OS state, and
when the one or more test operations are abnormal, the one or more first input pins for receiving the first group of signals among the plurality of first input pins have an abnormal OS state.

11. The semiconductor system of claim 9, wherein when the second group of signals outputted from the semiconductor device through the test operation is the same as the second group of signals inputted to the semiconductor device, one or more first input pins for receiving the second group of signals have a normal OS state, and
when the second group of signals outputted from the semiconductor device through the test operation is different from the second group of signals inputted to the semiconductor device, the one or more first input pins for receiving the second group of signals have an abnormal OS state.

12. The semiconductor system of claim 9, wherein the one or more test operations comprise an operation of controlling the semiconductor device to enter a mode for accessing the one or more registers, an operation of selecting a register to access among the one or more registers, an operation of storing the second group of command/address signals in the selected register, an operation of outputting the data stored in the selected register, and an operation of selecting a type to output the data stored in the selected register.

13. The semiconductor system of claim 11, further comprising a plurality of input/output pins configured to input/output data,
wherein when the OS states of the plurality of first input pins are determined to be normal, the semiconductor device outputs the respective bits of the data stored in all or part of the one or more registers to the corresponding input/output pins among the plurality of input/output pins, and tests the OS states of the plurality of input/output pins by comparing the data outputted to the plurality of input/output pins to the plurality of command/address signals inputted to the plurality of first input pins.

14. The semiconductor system of claim 11, further comprising a plurality of input/output pins configured to input/output data,
   wherein when the OS states of the plurality of first input pins are determined to be normal, the semiconductor device outputs the data stored in all or part of the one or more registers to each of the input/output pins, and tests the OS states of the plurality of input/output pins by comparing the data outputted to the plurality of input/output pins to the plurality of command/address signals inputted to the plurality of first input pins.

* * * * *